United States Patent
Mayama et al.

[11] Patent Number: 6,021,991
[45] Date of Patent: Feb. 8, 2000

[54] ACTIVE ANTI-VIBRATION APPARATUS

[75] Inventors: Takehiko Mayama; Hiroaki Kato, both of Utsunomiya, Japan

[73] Assignee: Canon Kabushiki Kaisha, Tokyo, Japan

[21] Appl. No.: 09/040,395

[22] Filed: Mar. 18, 1998

[30] Foreign Application Priority Data

Mar. 19, 1997 [JP] Japan ............................... 9-084706

[51] Int. Cl.[7] .................................................. F16M 13/00
[52] U.S. Cl. ........................... 248/550; 248/638; 188/267; 267/136
[58] Field of Search ..................... 248/550, 559, 248/562, 636, 638; 188/267, 378; 267/136, 140.14

[56] References Cited

U.S. PATENT DOCUMENTS

| | | | |
|---|---|---|---|
| 4,770,438 | 9/1988 | Sugasawa et al. ............... | 188/266.7 |
| 5,121,898 | 6/1992 | Yasuda et al. .................... | 248/550 |
| 5,124,938 | 6/1992 | Algrain ............................ | 248/550 |
| 5,285,995 | 2/1994 | Gonzalez et al. ................ | 248/636 |
| 5,478,043 | 12/1995 | Wakui ............................. | 248/550 |
| 5,653,317 | 8/1997 | Wakui ............................. | 248/550 |
| 5,750,897 | 5/1998 | Kato ............................... | 248/550 |
| 5,823,307 | 10/1998 | Schubert et al. ................. | 267/136 |

FOREIGN PATENT DOCUMENTS

| | | |
|---|---|---|
| 64-69838 | 3/1989 | Japan . |
| 6-181158 | 6/1994 | Japan . |
| 7-83276 | 3/1995 | Japan . |

*Primary Examiner*—Derek J. Berger
*Assistant Examiner*—Kimberly Wood Ku
*Attorney, Agent, or Firm*—Fitzpatrick, Cella, Harper & Scinto

[57] ABSTRACT

An active anti-vibration apparatus includes an anti-vibration mount, which has an actuator and a vibration sensor, for supporting an anti-vibration table, and a control unit for driving the actuator on the basis of output from the vibration sensor. The control unit separates the output from the vibration sensor into high frequency components and low frequency components, applies proper compensation calculation for the respective separated frequency components, and drives the actuator.

15 Claims, 8 Drawing Sheets

ACTIVE ANTI-VIBRATION APPARATUS

BACKGROUND OF THE INVENTION

The present invention relates to an active anti-vibration apparatus and, more particularly, to an active anti-vibration apparatus, having a vibration detector and an actuator, such as an air spring and a linear motor, which is used as a support mechanism in precision equipments, such as a semiconductor exposure apparatus.

Along with advances of precision equipments, such as an electron microscope and a semiconductor exposure apparatus, higher performance is required of a precision anti-vibration apparatus for mounting the equipment. Especially, in a semiconductor exposure apparatus, an anti-vibration table for removing vibrations, as much as possible, transmitted from outside the apparatus, e.g., vibration of the setting floor, is necessary for an appropriate and quick exposure operation. This is because vibration, which is harmful to an exposure operation, should be prevented from occurring in an exposure stage.

The semiconductor exposure apparatus has as its feature an intermittent operation called "step and repeat". Repeated step movement of an X-Y stage in this operation excites vibrations of an anti-vibration table. More specifically, reaction force of the X-Y stage movement and displacement of the X-Y stage excite vibrations. Accordingly, an anti-vibration table is required to have anti-vibration performance for removing vibrations transmitted from outside the apparatus, e.g., vibration of the setting floor, and vibration control performance for controlling vibrations due to operation of an equipment mounted on the anti-vibration table.

As for a method replacing the step and repeat operation, there is a scan exposure method often adopted by a semiconductor exposure apparatus. In the semiconductor exposure apparatus, it is necessary to remove vibrations transmitted from outside the apparatus, e.g., vibration of the setting floor, as much as possible, as well as instantaneously control vibrations of the anti-vibration table caused by scanning operation of an exposure stage. Particularly, since exposure is performed while the exposure stage is performing scanning in a scan exposure apparatus, high performance for eliminating vibrations transmitted from outside the apparatus and high performance for controlling vibrations due to operation of an equipment mounted on the anti-vibration table are demanded. Accordingly, an anti-vibration apparatus of high performance is required.

To meet this requirement, an active anti-vibration apparatus has been put in practice where vibrations of the anti-vibration table are detected by vibration sensors, and output signals from the vibration sensors are fed back to actuators used for controlling the anti-vibration table, thereby performing vibration control of the anti-vibration table. The active anti-vibration apparatus allows realization of anti-vibration performance and vibration control performance in a good balance, which is difficult to realize by a conventional passive anti-vibration apparatus constituted by a spring and a damper.

In a conventional active anti-vibration apparatus, in general, a control loop is configured for each pair of a vibration sensor, provided on an anti-vibration table, and an actuator provided at the nearest position of the vibration sensor, and controls vibrations, position and posture. In other words, a plurality of independent control loops are provided for different supporting positions of the anti-vibration table. FIG. 8 shows a configuration of a conventional active anti-vibration apparatus. An anti-vibration table 1001 for mounting a precision equipment, such as an X-Y stage, is supported by an anti-vibration mount 1002. Generally, a plurality of anti-vibration mounts are used to support the anti-vibration table 1001. For instance, if the anti-vibration table 1001 has a rectangular shape, four anti-vibration mounts are provided, one at each corner of the anti-vibration table 1001. In FIG. 8, one of those anti-vibration mounts is shown as the anti-vibration mount 1002.

The main configuration elements of the anti-vibration mount 1002 are as follows. The anti-vibration mount 1002 supports the anti-vibration table 1001 upwardly using a mechanical spring or an air spring (not shown), thereby isolating the anti-vibration table 1001 from vibrations of the setting floor. A rising member 1032 is connected to the anti-vibration table 1001 by a joint bolt 1031 and rises with the anti-vibration table 1001, and a base member 1033 is placed on the setting floor. A vertical acceleration sensor 1034 for measuring acceleration of the anti-vibration table 1001 in the vertical direction and a horizontal acceleration sensor 1003 for measuring acceleration of the anti-vibration table 1001 in the horizontal direction are fixed on the rising member 1032. Further, a vertical actuator 1021 for applying driving force to the anti-vibration table 1001 in the vertical direction and a horizontal actuator 1022 for applying driving force to the anti-vibration table 1001 in the horizontal direction are provided between the base member 1033 and the rising member 1032. Besides the above elements, the anti-vibration mount 1002 in practice includes other mechanisms, such as a viscous member, although they are not shown. Since FIG. 8 is a conceptual view of the configuration of the active anti-vibration apparatus, only the main configuration elements necessary for actively controlling vibrations are shown. When supporting the anti-vibration table 1001 with a plurality of vibration mounts, each vibration mount has the same configuration as that of the anti-vibration mount 1002 in FIG. 8.

Next, a configuration of a control system for actively controlling vibrations of the anti-vibration table 1001 using the anti-vibration mount 1002 is explained. There are many suggested configurations of control systems to be adopted by an active anti-vibration apparatus. According to a typical configuration among those suggested configurations, acceleration of vibration of the anti-vibration table 1001 is measured and force proportional to a velocity, which is an integrated value of the acceleration, is applied to the anti-vibration table 1001, thereby applying dumping force to the anti-vibration table 1001. FIG. 8 shows a mechanism of such a control system. The sign of a measurement signal outputted from the vertical acceleration sensor 1034 is changed by a sign changer 1035, and the sign-changed signal is operated by an acceleration compensator 1036. The obtained compensation value is inputted to a power amplifier 1010. The power amplifier 1010 drives the vertical actuator 1021 in accordance with the input signal, thereby driving force in the vertical direction is applied to the anti-vibration table 1001. By performing negative feedback for vertical acceleration of the anti-vibration table 1001 as described above, damping force in the vertical direction is applied to the anti-vibration table 1001. Note, in a case where the vertical actuator 1021 is a voice coil motor, the acceleration compensator 1036 performs integration in order to generate a velocity signal from an acceleration signal, whereas in a case where the vertical actuator 1021 is an air spring, the acceleration compensator 1036 performs proportional action since the vertical actuator 1021 itself has integrating characteristics. The same operation as described above is performed in the horizontal direction. Namely, the sign of a measurement signal outputted from the horizontal acceleration sensor 1003 is changed by the sign changer 1035, and the sign-changed signal is operated by the acceleration compensator 1036. The obtained compensation value is inputted to the power amplifier 1010. The power amplifier 1010 drives the horizontal actuator 1022 in accordance with the input signal, thereby driving force in the horizontal direction is applied to the anti-vibration table 1001. By performing negative feedback for horizontal acceleration of the anti-vibration table 1001 as described above, damping force in the horizontal direction is applied to the anti-vibration table 1001. Note, in a case where the horizontal actuator 1022 is a voice coil motor, the acceleration compensator 1036 performs integration in order to generate a velocity signal from an acceleration signal, whereas in a case where the horizontal actuator 1022 is an air spring, the acceleration compensator 1036 performs proportional action since the actuator 1022 itself has integrating characteristics. In a case where the anti-vibration table 1001 is supported by a plurality of anti-vibration mounts, a configuration of a control system of each anti-vibration mount is the same as that of the anti-vibration mount 1002 in FIG. 8.

However, in the active anti-vibration apparatus controlled in the aforesaid method, parameters used in the control loop constituted for each anti-vibration member do not correspond one-to-one to movement of each of motion modes, such as parallel translation and rotation, of an anti-vibration table. Accordingly, it is not easy to design and adjust control parameters in good perspective in consideration of stability and performance of the control system. In the aforesaid system, it is very difficult to arbitrarily adjust motion characteristics of the anti-vibration apparatus by adjusting control parameters for improving vibration control performance, since control systems which are independently provided for a plurality of supporting portion of an anti-vibration table interfere with each other.

In order to overcome the aforesaid problems, anti-vibration apparatuses which perform vibration control for each of motion modes, such as translation and rotation, of an anti-vibration table and control methods therefor are suggested as disclosed in Control Apparatus for Anti-Vibration Table of Japanese Patent Application Laid-Open No. 6-181158, Control Apparatus for Vertical-Direction-Air-Spring Type Anti-Vibration Table of Japanese Patent Application Laid-Open No. 7-83276, for instance, and effectiveness of the apparatuses and the control methods has been confirmed. A control system, adopted by these apparatuses and methods, which performs motion mode independent control focuses on vibrations of rigid body motion of the anti-vibration table 1001 in general, whereas the control system as explained with reference to FIG. 8 focuses on vibrations of a portion of the anti-vibration table 1001 where the anti-vibration mount 1002 supports, in other words, local vibrations of the anti-vibration table 1001. The motion mode independent control is briefly explained below.

FIG. 9 shows a configuration of an anti-vibration apparatus which controls an anti-vibration table for each motion mode independently. In the anti-vibration apparatus, a motion mode extractor 1006 extracts information on respective motion modes, such as translation and rotation, of the anti-vibration table 1001 on the basis of outputs from vibration sensors 1003*a*, 1003*b* and 1003*c*, such as acceleration sensors, and a compensation calculation circuit 1007 calculates a compensation value for each motion mode. Then, a thrust distributor 1008 distributes the calculated compensation signals for the respective motion modes to actuators, provided on active anti-vibration mounts 1002*a*, 1002*b*, 1002*c* and 1002*d*, for applying control force to the anti-vibration table 1001. The actuators provided on the active anti-vibration mounts 1002*a* to 1002*d* are driven by driving circuits 1010*a*, 1010*b*, 1010*c* and 1010*d*, respectively.

In such the active anti-vibration apparatus, control parameters, which are conventionally determined by greatly depending upon trial-and-error method for each of the control loops of the anti-vibration table, can be designed and adjusted by focusing on motion modes of the anti-vibration table, namely, overall motion characteristics of the anti-vibration table. Thus, it is possible to adjust and design the control parameters used in the anti-vibration apparatus easily and rationally.

FIG. 10 shows a configuration of an anti-vibration apparatus adopting another motion mode independent control method. In FIG. 10, four corners of the anti-vibration table 1001, which is roughly expressed as a rectangular solid, are supported by the anti-vibration mounts 1002*a* to 1002*d*. The anti-vibration mounts 1002*a* to 1002*d* have an identical configuration, and in which of the four anti-vibration mounts 1002*a* to 1002*d* elements are included is distinguished by supplemental alphabets, a to d, attached behind reference numerals of configuration elements. The anti-vibration mount 1002*a* includes a vertical acceleration sensor 1034*a*, a horizontal acceleration sensor 1003*a*, a vertical actuator 1021*a*, and a horizontal actuator 1022*a*. An X-Y-Z orthogonal coordinate system is defined with respect to the anti-vibration table 1001 in such a manner that the origin of the X-Y-Z coordinate system is set at the center of gravity G of the anti-vibration table 1001, and X- and Y-axes are respectively parallel to two sides of the anti-vibration table 1001 having a rectangular solid, and a Z-axis is set in the normal direction to the anti-vibration table 1001. Accordingly, the displacement of the anti-vibration table 1001 can be expressed as motions of 6-degree-of-freedom constituted by translation x along the X-axis, translation y along the Y-axis, translation z along the Z-axis, rotational motion θx about the X-axis, rotational motion θy about the Y-axis, and rotational motion θz about the Z-axis. In the motion mode independent control performed by the apparatus shown in FIG. 10, negative feedback for acceleration is performed by each of motion modes of 6-degree-of-freedom and damping force is applied to the anti-vibration table 1001.

The motion mode extractor 1006 calculates acceleration of each of the motion modes, namely, acceleration of the translation Ax along the X-axis, acceleration of the translation Ay along the Y-axis, acceleration of the translation Az along the Z-axis, angular acceleration of the rotation motion Aθx about the X-axis, angular acceleration of the rotation motion Aθy about the Y-axis, and angular acceleration of the rotation motion Aθz about the Z-axis, on the basis of measurement signals from the vertical acceleration sensors 1034*a* to 1034*d* and the horizontal acceleration sensors 1003*a* to 1003*d*, then outputs the calculated results. Then, the sign of acceleration of each of the motion modes is inverted by the sign changer 1035, the sign-inverted signal is operated by the acceleration compensator 1036, thereby generating the compensation value for each motion mode. The thrust distributor 1008 generates driving instructions for the vertical actuators 1021*a* to 1021*d* and the horizontal actuators 1022*a* to 1022*d* on the basis of the inputted compensation values, and transmits them to the power amplifier 1010. The thrust distributor 1008 generates driving instructions for the vertical actuators 1021*a* to 1021*d* and the horizontal actuators 1022*a* to 1022*d* so that driving force, generated by the acceleration compensator 1036 for the respective motion modes, to be applied to the anti-vibration table 1001 corresponds to the total force generated by the vertical actuators 1021a to 1021d and the horizontal actuators 1022a to 1022d. The power amplifier 1010 drives the vertical actuators 1021a to 1021d and the horizontal actuators 1022a to 1022d in accordance with the inputted driving instruction signals, thereby applying the driving force to the anti-vibration table 1001. As described above, in the motion mode independent control, negative feedback for acceleration is performed for each of a plurality of motion modes, thereby applying damping force to the anti-vibration table 1001 to restrain vibrations of the anti-vibration table 1001. Note, in a case where the vertical actuators 1021a to 1021d and the horizontal actuators 1022a to 1022d are voice coil motors, the acceleration compensator 1036 performs integration in order to generate a velocity signal from an acceleration signal, whereas in a case where the vertical actuators 1021a to 1021d and the horizontal actuators 1022a to 1022d are air springs, the acceleration compensator 1036 performs proportional action since the actuators themselves have integrating characteristics.

An arrangement of the anti-vibration mounts 1002a to 1002d will be explained. As for the vertical direction, measurement directions of the vertical acceleration sensors 1034a to 1034d and operation directions of the vertical actuators 1021a to 1021d match the Z-axis direction. Regarding horizontal directions, the anti-vibration mounts 1002a to 1002d are arranged in such a manner that the measurement directions of the horizontal acceleration sensors 1003a and 1003c and operation directions of the horizontal actuators 1022a and 1022c of the anti-vibration mounts 1002a and 1002c match the X-axis direction, and measurement directions of the horizontal acceleration sensors 1003b and 1003d and operation directions of the horizontal actuators 1022b and 1022d of the anti-vibration mounts 1002b and 1002d match the Y-axis direction. The reason for arranging the anti-vibration mounts 1002a to 1002d as described above is that all the motion modes of 6-degree-of-freedom of the anti-vibration table 1001 can be measured by the vertical acceleration sensors 1034a to 1034d and the horizontal acceleration sensors 1003a to 1003d, and the vibrations of the anti-vibration table 1001 can be controlled by the vertical actuators 1021a to 1021d and the horizontal actuators 1022a to 1022d.

In a method for controlling an anti-vibration table for each motion mode, it is necessary to detect movement of the anti-vibration table by each motion mode in satisfactory precision and properly distribute thrust to actuators in correspondence with driving instruction signals of respective motion modes. In a practical anti-vibration apparatus, however, due to spatial and mechanical limitation for connecting the anti-vibration mounts to the anti-vibration table or an equipment, for instance, to be isolated from vibrations, there are cases in which rigidity of connecting portions between the anti-vibration mount, and the vibration sensor and an actuator, and joint rigidity between the anti-vibration mount and the anti-vibration table are not secured satisfactorily. For this reason, various local vibrations may occur at various portion around the anti-vibration table.

In the method for controlling the anti-vibration table for each motion mode, vibrations are controlled by focusing on rigid body motion modes of the anti-vibration table, or on rigid body motion modes and several deformed motion modes having natural frequencies in a relatively low frequency region. However, when local vibrations of deformed motion modes having natural frequencies of relatively high frequencies occur around the vibration sensor or the actuator, or in the anti-vibration table itself, a vibration signal of each motion mode of the anti-vibration table may not be correctly extracted due to the effect of the local vibrations, further, thrust may not be correctly distributed in correspondence with a compensation signal for each motion mode. When vibration control is performed by mainly focusing on rigid body motion modes having natural frequencies in a lower frequency region under the aforesaid situation, local vibrations of very high frequencies exert a bad influence on control performance. If the worst comes to the worst, so-called "spill-over" unstability occurs and a very big vibration would be excited in the anti-vibration table.

The "spill-over" is a phenomenon in which the subject of vibration control becomes unstable due to an effect of a motion mode of a higher degree than the degrees of vibration modes which the vibration control expects. For example, in a system capable of controlling motion modes of n-degrees, an effect of motion mode of (n+1)-degrees cannot be reflected in a control logic, and unstabilizes the system as disturbance.

By using the proper number of vibration sensors and actuators so as to be able to extract signals of a large number of motion modes of various local vibrations and distribute thrust in correspondence with the compensation signals of the large number of motion modes, it is possible to avoid the aforesaid problem by performing appropriate compensation calculations and vibration control. However, as an industrial device, it is not realistic to use too many vibration sensors and actuators since cheaper manufacturing cost is required.

As described above, the active anti-vibration apparatus measures vibrations of the anti-vibration table, which is to be supported, by the acceleration sensors, and drives the actuators in accordance with the measurement signals, thereby controls vibrations of the anti-vibration table. Conventionally, an acceleration sensor is fixed on the rising member 1032 of the anti-vibration mount 1002, as shown in FIG. 8. The rising member 1032 is joined to the anti-vibration table 1001 by the joint bolt 1031, thus, vibrations of the anti-vibration table 1001 theoretically match vibrations of the rising member 1032. Therefore, it should be possible to measure the vibrations of the anti-vibration table 1001 by the acceleration sensor fixed to the rising member 1032 without any problem. However, vibrations of the anti-vibration table 1001 do not match vibrations of the rising member 1032 in practice. A measurement signal of the acceleration sensor which is fixed to the rising member 1032 includes not only vibrations of the anti-vibration table 1001 but also vibrations peculiar to the rising member 1032 which do not occur in the anti-vibration table 1001. Moreover, the peculiar vibrations of the rising member 1032 cannot be ignorable when its acceleration is considered with respect to that of vibrations of the anti-vibration table 1001.

The peculiar vibration of the rising member 1032 is due to low mechanical rigidity of the rising member 1032. In a semiconductor exposure apparatus, the mass and rigidity of the anti-vibration table 1001 for mounting precision equipment, such as an X-Y stage for exposure operation and an illumination mechanism, is sufficiently large. In contrast, the rising member 1032 is thinner and has much lower rigidity compared to the anti-vibration table 1001. Further, the rigidity of the joint portion between the rising member 1032 and the anti-vibration table 1001 by the joint bolt 1031 may also cause a problem. Since the rising member 1032 is joined to the anti-vibration table 1001 in a state as a cantilever, as shown in FIG. 8, when the joint rigidity is low, vibrations having a node at the joint portion may occur in the rising member 1032. To increase the thickness of the rising member 1032 for securing enough rigidity is not realistic since that results in increase in the both size and weight of the anti-vibration mount 1002.

Furthermore, joint rigidity of the joint portion cannot be increased infinitely, and is limited to a certain level. Therefore, it is practically impossible to avoid the problem in which the peculiar vibrations of the rising member 1032 occur and the vibrations of the rising member 1032 do not match vibrations of the anti-vibration table.

When the peculiar vibrations of the rising member 1032 is included in measurement signals by the acceleration sensors, performance of the active anti-vibration apparatus is greatly debased. As shown in FIG. 8, a typical control system of the active anti-vibration apparatus is to give damping force to the anti-vibration table 1001 by performing negative feedback to acceleration. If the vibrations of the rising member 1032 to which an acceleration sensor is fixed do not match the vibrations of the anti-vibration table 1001 which is to be controlled, it is impossible to properly apply damping force to the anti-vibration table 1001. Furthermore, since the mass of the rising member 1032 is generally much smaller than that of the anti-vibration table 1001, the peculiar vibrations of the rising member 1032 at resonance is much larger than the vibrations of the anti-vibration table 1001 when accelerations of vibrations are considered. For this reason, it is difficult, in most cases, to completely remove components originated from the peculiar vibrations of the rising member 1032 from measurement signals from the acceleration sensors even when the measurement signals are processed by a band-pass filter constituted by a low-pass filter and a high-pass filter. If vibration of acceleration measured by the acceleration sensor is affected by resonance of the rising member 1032, sufficient vibration control cannot be achieved, thereby it is not possible for the active anti-vibration apparatus to fully utilize its vibration control ability. Furthermore, when the actuator is driven in resonant range of the rising member 1032 in order to cancel the resonant vibration of the rising member 1032, there is a danger that resonant vibration of the rising member 1032 is further stimulated, which eventually causes so-called spill-over phenomenon that unstabilizes the control system.

Further, in the active anti-vibration apparatus realizing the motion mode independent control as shown in FIG. 10, there is a problem in which motion mode independent control cannot be correctly realized because of peculiar vibrations occurring on the rising member 1032. In the motion mode independent control, accelerations of motion modes of 6-degree-of-freedom, Ax, Ay, Az, A$\theta$x, A$\theta$y, and A$\theta$z, of the anti-vibration table 1001 are generated by performing calculation on the basis of the measurement signals from respective acceleration sensors. Therefore, if a vibration component other than the vibrations of the anti-vibration table is included in the measurement signals, the correct calculation for extracting the motion modes cannot be performed. In other words, a control system which performs negative feedback for acceleration of each motion mode cannot be configured. Under this situation, it is not possible for the active anti-vibration apparatus to operate at full performance for controlling and removing vibrations. This debasement of performance of the active anti-vibration apparatus directly causes debasement of performance of an overall apparatus, such as a semiconductor exposure apparatus.

SUMMARY OF THE INVENTION

The present invention has been made in consideration of the above situation, and has as its first object to provide an anti-vibration apparatus, which controls an anti-vibration table for each motion mode, capable of realizing stable and excellent vibration control even in a case where various local vibrations occur in various positions in the anti-vibration table.

It is the second object of the present invention to provide an anti-vibration apparatus capable of avoiding the aforesaid spill-over phenomena and deterioration of performance by excluding a vibration component other than vibration components of the anti-vibration table, which is to be supported, from a measurement signal by an acceleration sensor.

According to the present invention, the foregoing objects are attained by providing an active anti-vibration apparatus comprising: an anti-vibration table, supported by anti-vibration supporting mechanism, for mounting precision equipment; a plurality of actuators for applying control power to the anti-vibration table; a plurality of vibration detection means for detecting vibrations of the anti-vibration table; a low-pass filter for transmitting frequency components which are lower than a predetermined frequency out of signals outputted from the vibration detection means; a high-pass filter for transmitting frequency components which are higher than a predetermined frequency out of the signals outputted from the vibration detection means; motion mode extraction means for extracting vibration signals of motion modes on the basis of extracted signals having the frequency components which are lower than the predetermined frequency obtained as output signals from the low-pass filter; first compensation calculation means for compensating the vibration signals from the motion mode extraction means; thrust distribution means for distributing a compensation signal for each motion mode obtained by the first compensation calculation means as driving instruction signals of the plurality of actuators; second compensation calculation means for compensating extracted signals having the frequency components which are higher than the predetermined frequency obtained as output signals from the high-pass filter; and means for adding output signals from the thrust distribution means and the second compensation calculation means and feeding back the added result to the actuators.

Preferably, cut-off frequencies of the low-pass filter and the high-pass filter are higher than natural frequencies of all rigid body motion modes of the anti-vibration table.

Further, as the actuators, a pneumatic actuator, a linear motor which is driven by electromagnetic power, such as a voice coil motor, or combination thereof can be used. Especially, when the pneumatic actuator or the combination of the pneumatic actuator and the linear motor is used, the pneumatic actuator functions as the anti-vibration supporting mechanism. Furthermore, as the vibration detection means, an acceleration sensor can be used.

In the active anti-vibration apparatus, vibrations of the anti-vibration table, supported by the anti-vibration supporting mechanism, for mounting precision equipments are detected by the plurality of vibration detection means, the frequency components which are lower than the predetermined frequency out of the signals outputted from the vibration detection means are extracted by the low-pass filter, and the frequency components which are higher than the predetermined frequency out of the signals outputted from the vibration detection means are extracted by the high-pass filter. Then, the vibration signals of motion modes, such as translation and rotation of the anti-vibration table, are extracted on the basis of extracted signals having the frequency components, which are lower than the predetermined frequency, obtained as output signals from the low-pass filter, and the extracted signals of the motion modes are properly compensated. Further, the compensation signal for each motion mode is distributed as the driving instruction signals of the plurality of actuators. Meanwhile, the output signals from the high-pass filter are properly compensated. The distributed signal and the compensation signal of the output signals from the high-pass filter are added and fed back to the actuators for applying control force on the anti-vibration table.

Further, the foregoing second object is attained by providing an active anti-vibration apparatus having an anti-vibration table, an acceleration sensor, an active anti-vibration mount, which includes an actuator, for supporting the anti-vibration table, and control means for driving the actuator on the basis of a measurement signal by the acceleration sensor, wherein the acceleration sensor is fixed on the anti-vibration table.

The foregoing second object can be also attained by providing an active anti-vibration apparatus having an anti-vibration table, a vertical acceleration sensor, a horizontal acceleration sensor, an active anti-vibration mount, which includes a vertical actuator, and a horizontal actuator, for supporting the anti-vibration table, and control means for driving the vertical and horizontal actuators on the basis of measurement signals by the vertical and horizontal acceleration sensors, wherein the vertical and horizontal acceleration sensors are fixed on the anti-vibration table.

The active anti-vibration apparatus as described above can be applicable to an anti-vibration apparatus having: motion mode extraction means for extracting motion mode relating to acceleration from measurement signals by the acceleration sensor; and motion mode distribution means for generating a driving instruction to the actuator on the basis of a compensated signal obtained by compensating output from the motion mode extraction means.

According to the active anti-vibration apparatus, since the acceleration sensor is fixed to the anti-vibration table which is to be supported, the peculiar vibrations of a partial mechanism of the anti-vibration apparatus, such as a rising member, do not affect the measurement signal by the acceleration sensor. Therefore, the acceleration sensor can precisely measure acceleration of vibrations only of the anti-vibration table. Thus, it is possible to prevent high-degree resonance of the partial mechanism, such as resonance of the rising member, from affecting acceleration of the anti-vibration table which is to be negatively fed back. Accordingly, it becomes unnecessary to drive the actuator in the resonant range of the rising member since acceleration due to vibration peculiar to the rising member is not included in measurement signals from the acceleration sensors, therefore, the spill-over phenomenon caused by high-degree resonance is avoided, which dramatically increases stability of the control system. Furthermore, since it is unnecessary to increase the thickness of the rising member for attaining sufficient rigidity, the anti-vibration apparatus can be lightened. Further, it is unnecessary to increase rigidity of a joint portion between the anti-vibration mount and the anti-vibration table, work for assembling the anti-vibration apparatus and maintenance work are simplified.

In this active anti-vibration apparatus, a precise acceleration of each motion mode can be generated as a result of calculation on the basis of measurement signals from the acceleration sensors, therefore, motion mode independent control can be ideally performed. Even when peculiar vibrations occur in a partial mechanism of the anti-vibration apparatus, such as the rising member, the motion-mode independent control is not affected by the vibrations.

According to one aspect of the present invention, cut-off frequencies of the low-pass filter and the high-pass filter are higher than natural frequencies of all rigid body motion modes of the anti-vibration table.

Further, according to another aspect of the present invention, each of the actuators is a pneumatic actuator, a linear motor which is driven by electromagnetic power, such as a voice coil motor, or combination thereof.

Furthermore, according to another aspect of the present invention, each of the actuators is the pneumatic actuator or the combination of the pneumatic actuator and the linear motor, and the pneumatic actuator functions as the anti-vibration supporting mechanism.

Further, according to another aspect of the present invention, each of the vibration detection means is an acceleration sensor.

Further, according to another aspect of the present invention, the control means comprises: motion mode extraction means for extracting motion mode relating to acceleration from measurement signals by the acceleration sensor; and motion mode distribution means for generating a driving instruction to the actuator on the basis of a compensated signal obtained by compensating output from the motion mode extraction means.

Further, according to another aspect of the present invention, the first compensation calculation means performs gain compensation, integration compensation, or combination thereof.

Further, according to another aspect of the present invention, the first compensation calculation means performs compensation calculation on the basis of the vibration signals of the motion modes while interfering the vibration signals with each other.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will be described in detail in accordance with the accompanying drawings.

First Embodiment

The object of the first embodiment is to realize stable and excellent vibration control by controlling an anti-vibration table for each motion mode even in a case where various local vibrations occur in each portion of the anti-vibration table.

Figure 1:
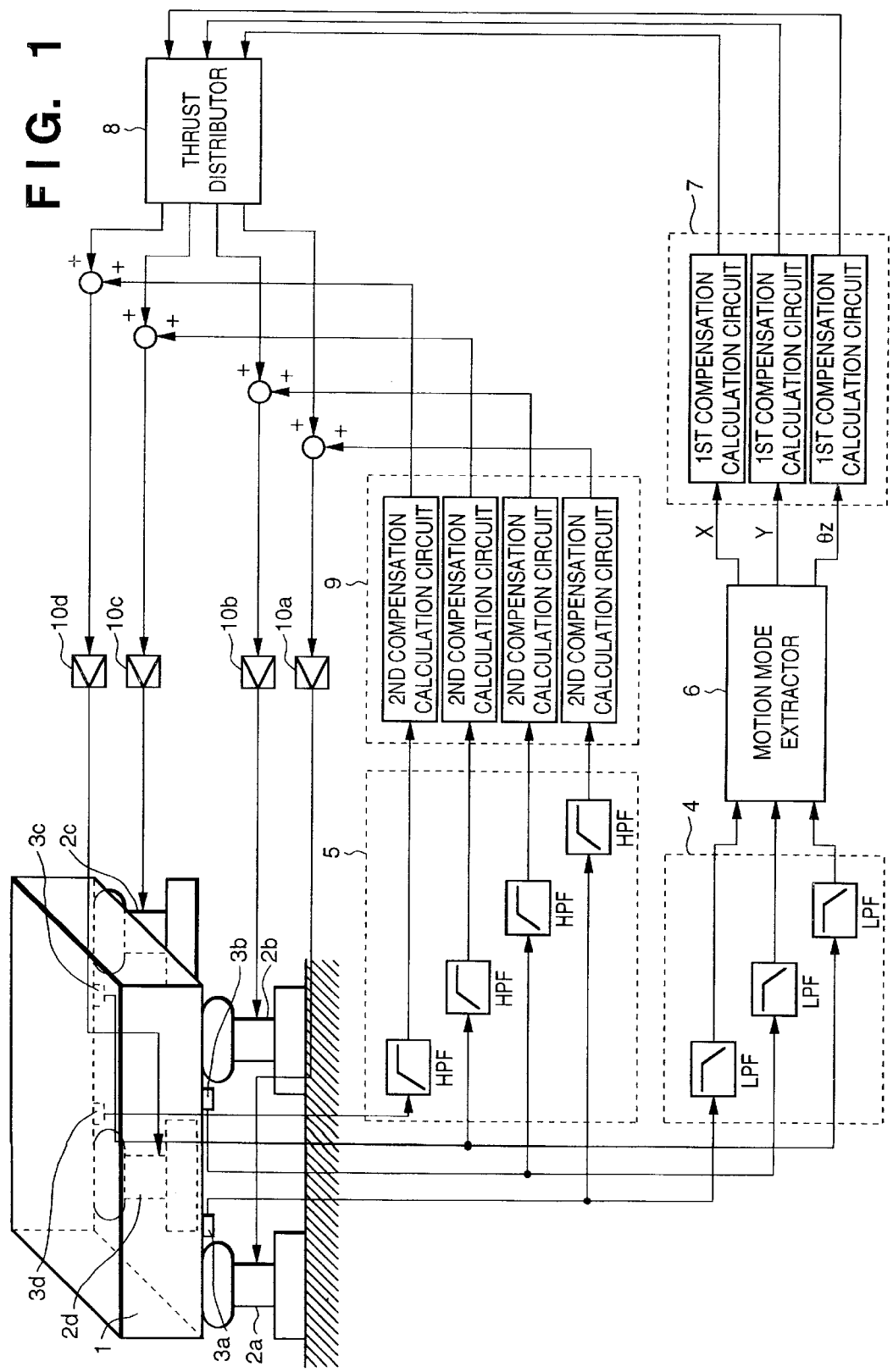
FIG. 1 is a diagram illustrating a configuration of an active anti-vibration apparatus according to a first embodiment of the present invention.

FIG. 1 is a diagram illustrating a configuration of an active anti-vibration apparatus according to a first embodiment of the present invention. Note, an anti-vibration apparatus which controls vibrations in the horizontal direction is explained as an example in the first embodiment. However, the following means, which will be explained in detail, can be applied to an active anti-vibration apparatus which controls vibrations in the vertical direction. Further, the anti-vibration apparatus which controls motion of 3-degree-of-freedom constituted by horizontal translation of 2-degree-of-freedom and rotation of 1-degree-of-freedom about a vertical axis is explained in the first embodiment. However, the present invention is not limited to this, and a control system for controlling vibrations due to other rigid body motion modes of 3-degree-of-freedom constituted by vertical translation of 1-degree-of-freedom and rotation of 2-degree-of-freedom about horizontal axes may be added to the active anti-vibration apparatus of the first embodiment.

The active anti-vibration apparatus shown in FIG. 1 includes: an anti-vibration table 1 for mounting precision equipments, such as a semiconductor exposure apparatus; active anti-vibration mounts 2a to 2d having supporting means for supporting the anti-vibration table 1 against vibrations and actuators for applying active control power to the anti-vibration table 1; vibration sensors 3a to 3d for detecting vibrations of the anti-vibration table 1; low-pass filters (LPFs) 4 for transmitting frequency components, which are lower than a predetermined frequency, of signals outputted from the vibration sensors 3a to 3c; high-pass filters (HPFs) 5 for transmitting frequency components, which are higher than a predetermined frequency, of signals outputted from the vibration sensors 3a to 3d; motion mode extractor 6 for extracting vibration signals of the respective motion modes, such as translation and rotation of the anti-vibration table 1, out of the low frequency component signals outputted from the low-pass filters 4; first compensation calculation circuits 7 for performing compensation calculation on the basis of the vibration signals, extracted by the motion mode extractor 6, of the respective motion modes of the anti-vibration table 1; a thrust distributor 8 to distribute thrust instruction signals for the respective motion modes and moment instruction signals obtained as outputs of the first compensation calculation circuits 7 in correspondence with the active anti-vibration mounts 2a to 2d; second compensation calculation circuits 9 for performing proper compensation calculation on the high frequency component signals outputted from the high-pass filters 5; and driving circuits 10a to 10d for driving the actuators mounted on the active anti-vibration mounts 2a to 2d on the basis of the signals obtained by adding the output signals from the thrust distributor 8 and the output signals from the second compensation calculation circuits 9.

The cut-off frequencies of the low-pass filters 4 and the high-pass filters 5 are preferably higher than the natural frequencies of all the rigid body motion modes of the anti-vibration table 1.

Each of the active anti-vibration mounts 2a to 2d has a spring for supporting the anti-vibration table 1 against vibrations, a damper, and an actuator for applying active control power to the anti-vibration table 1.

Figure 2:
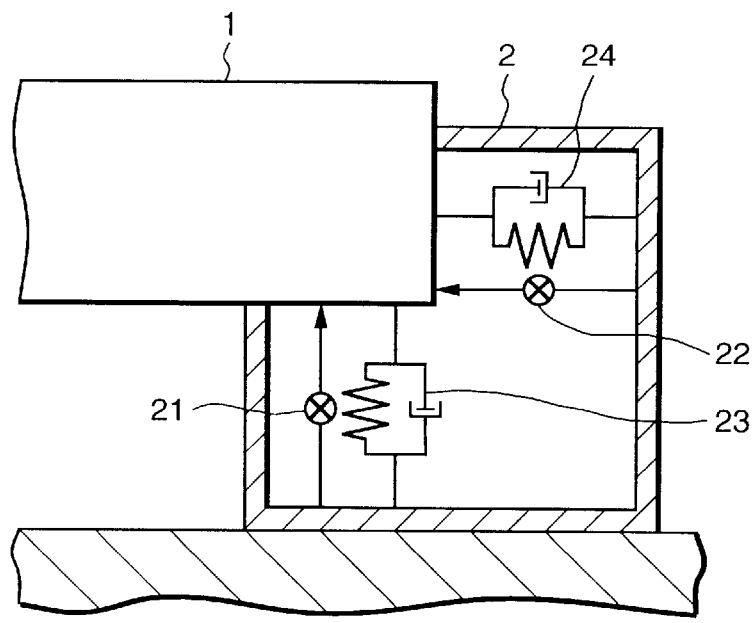
FIG. 2 is a view showing a brief configuration of an active anti-vibration mount of the active anti-vibration apparatus shown in FIG. 1.

FIG. 2 is a diagram illustrating a configuration of the active anti-vibration mounts 2a to 2d shown in FIG. 1. The portion referred by reference numeral 2 represents each of the active anti-vibration mounts 2a to 2d.

The active anti-vibration mounts 2 (i.e., any one of 2a to 2d) has a vertical actuator 21 for applying control power in the vertical direction to the anti-vibration table 1; a horizontal actuator 22 for applying control power in the horizontal direction to the anti-vibration table 1; a vertical supporting member 23 for supporting the anti-vibration table 1 against vibrations in the vertical direction; and a horizontal supporting member 24 for supporting the anti-vibration table 1 against vibrations in the horizontal direction.

As the vertical actuator 21 and the horizontal actuator 22, a linear motor run by electromagnetic power, such as a voice coil motor, a pneumatic actuator which is controlled by controlling internal pressure of an air spring by supplying or discharging air to/from the air spring via a valve, or a combination thereof can be used. When a pneumatic actuator using the aforesaid air spring is used as the vertical actuator 21 and the horizontal actuator 22, they can also serve as the vertical supporting member 23 and the horizontal supporting member 24, respectively.

As the vibration sensors 3a to 3d, acceleration sensors can be used. The vibration sensors 3a to 3d are desired to be arranged near or inside of the active anti-vibration mounts 2a to 2d, respectively.

Next, an operation of the anti-vibration apparatus shown in FIG. 1 is explained. First, vibrations of the anti-vibration table 1 supported against vibrations by the active anti-vibration mounts 2a to 2d are detected by the vibration sensors 3a to 3d, such as acceleration sensors. Then, frequency components which are lower than a predetermined frequency are extracted from the output signals from the vibration sensors 3a to 3c by the low-pass filters 4, and frequency components which are higher than a predetermined frequency are extracted from the output signals from the vibration sensors 3a to 3d by the high-pass filters 5.

Then, the motion mode extractor 6 extracts vibration signals corresponding to the respective motion modes of translation and rotation of the anti-vibration table 1 out of the low frequency component signals outputted from the low-pass filters 4, and the first compensation calculation circuits 7 perform proper compensation calculation on the vibration signals of the respective motion modes of the anti-vibration table 1 which are extracted by the motion mode extractor 6. A thrust instruction signal and a moment instruction signal, obtained as outputs of the first compensation calculation circuits 7 for the respective motion modes, are processed to be distributed as signals for the active anti-vibration mounts 2a to 2d by the thrust distributor 8.

Meanwhile, the high frequency components outputted from the high-pass filters 5 are processed with compensation calculation by the second compensation calculation circuits 9.

Then, the driving circuits 10a to 10d operate the actuators mounted on the active anti-vibration mounts 2a to 2d on the basis of signals obtained by adding the output signals, namely, signals distributed for the active anti-vibration mounts 2a to 2d, from the thrust distributor 8 and output signals from the second compensation calculation circuits 9.

Note, in the first embodiment, the low-pass filters 4 process output signals from the vibration sensors 3a to 3c, but do not process an output signal from the vibration sensor 3d. This is because the anti-vibration apparatus is for controlling horizontal motion of 3-degree-of-freedom of the anti-vibration table 1, and the signals of motion modes of 3-degree-of-freedom, namely, horizontal translation of 2-degree-of-freedom and rotation of 1-degree-of-freedom can be extracted on the basis of output signals of at least three vibration detectors. Of course, it is possible to process the output signal from the vibration sensor 3d by an extra low-pass filter 4 and extract signals of the respective motion modes of the anti-vibration table 1 on the basis of the frequency component signals, which are lower than the predetermined frequency, out of the output signals from the vibration sensors 3a to 3d.

Further, a method for performing pre-processes on the output signals from the vibration sensors 3a to 3d using signal processing means, such as a direct-current component elimination filter, low-pass filter, and a band-pass filter, before performing compensation calculation is widely used for controlling this kind of apparatus. Such filters are not shown in FIG. 1, however, an apparatus which processes output signals from the vibration sensors 3a to 3d by such filters and further processes the processed signals by the low-pass filters 4 and the high-pass filters 5 of the first embodiment is also included in the present invention.

Next, the calculation processes performed in the motion mode extractor 6 and the thrust distributor 8 are explained.

Operation function for extracting motion modes performed in the motion mode extractor 6 and operational function used in the thrust distributor 8 are determined on the basis of, e.g., a geometric arrangement of the vibration sensors 3a to 3c and the active anti-vibration mounts 2a to 2d.

Figure 3:
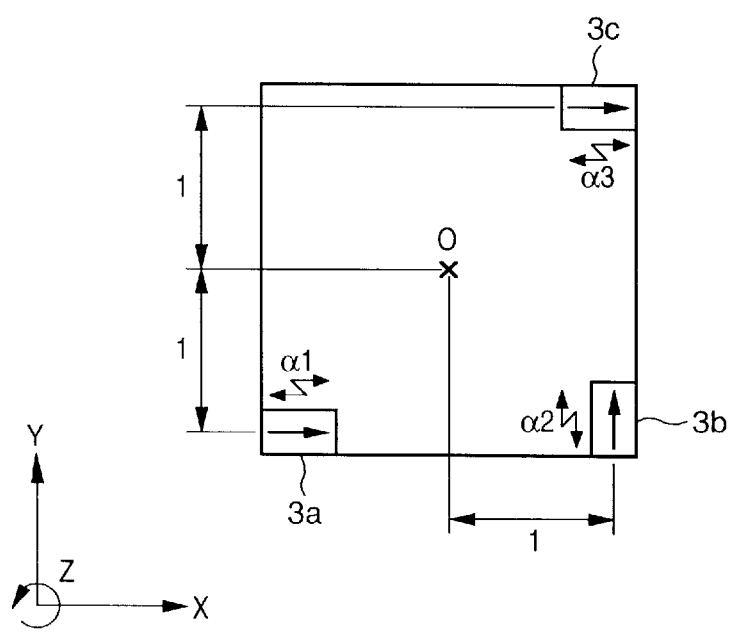
FIG. 3 is an explanatory view showing an arrangement of sensors for detecting vibrations of an anti-vibration table of the active anti-vibration apparatus shown in FIG. 1.

For example, assume that the vibration sensors 3a to 3c are arranged as shown in FIG. 3. In this case, the vibration detection direction of each of the vibration sensors 3a to 3c is as shown by an arrow in the corresponding block, then detected vibration signals α1, α2 and α3 are expressed by translation vibration components, αx and αy, in the two orthogonal horizontal directions, X and Y, of the anti-vibration stage 1 and rotational vibration component, αθ, about a vertical axis Z which is normal to the horizontal plane, as shown by the following equation (1). Here, position relationship between the origin of the coordinate system O and each of the vibration sensors 3a to 3c is as shown in FIG. 3.

$$\begin{pmatrix} \alpha 1 \\ \alpha 2 \\ \alpha 3 \end{pmatrix} = \begin{pmatrix} 1 & 0 & 1 \\ 0 & 1 & 1 \\ 1 & 0 & -1 \end{pmatrix} \begin{pmatrix} \alpha x \\ \alpha y \\ \alpha \theta \end{pmatrix} \quad (1)$$

Therefore, the signal of the vibration components of the respective motion modes can be obtained by inverse matrix operation using the following equation (2), $$\begin{pmatrix} \alpha x \\ \alpha y \\ \alpha \theta \end{pmatrix} = \begin{pmatrix} 1 & 0 & 1 \\ 0 & 1 & 1 \\ 1 & 0 & -1 \end{pmatrix}^{-1} \begin{pmatrix} \alpha 1 \\ \alpha 2 \\ \alpha 3 \end{pmatrix} \quad (2)$$

In short, the vibration components of the respective motion mode can be obtained on the basis of the following equation (3), $$\begin{pmatrix} \alpha x \\ \alpha y \\ \alpha \theta \end{pmatrix} = \frac{1}{2} \begin{pmatrix} 1 & 0 & 1 \\ -1 & 2 & 1 \\ 1 & 0 & -1 \end{pmatrix} \begin{pmatrix} \alpha 1 \\ \alpha 2 \\ \alpha 3 \end{pmatrix} \quad (3)$$

Note, operational function for extracting vibration signals of the respective motion modes of translation in the horizontal plane and rotation of the anti-vibration table 1 on the basis of output signals from the vibration sensors 3a to 3c is shown, however, the present invention is not limited to this. For example, it is possible to derive an operational function for extracting vibration signals of the respective motion modes of translation in the vertical direction and rotation about horizontal axes, and operational function for extracting vibration signals of rigid body motion modes of 6-degree-of-freedom by applying the aforesaid method. Further, in the Control Apparatus of Vertical Direction Air Spring Type Anti-Vibration Table disclosed in the Japanese Patent Application Laid-Open No. 7-83276, in addition to a method for deriving vibration components of the rigid body motion modes, as described above, a method for deriving vibration components of non-rigid body of the apparatus itself on the basis of outputs from four sensors is disclosed, and these methods are applicable to the present invention. Further, the distances between the origin O of the coordinate system and the detection axes of the respective vibration sensors are unit distance (e.g., 1) as shown in FIG. 3, however, it is possible to derive the vibration components in the similar manner when the distances are other than the unit distance.

Furthermore, the operational function to be used in the thrust distributor 8 is determined on the basis of geometrical relationship of the arrangement of the actuators mounted on the active anti-vibration mounts 2a to 2d.

Figure 4:
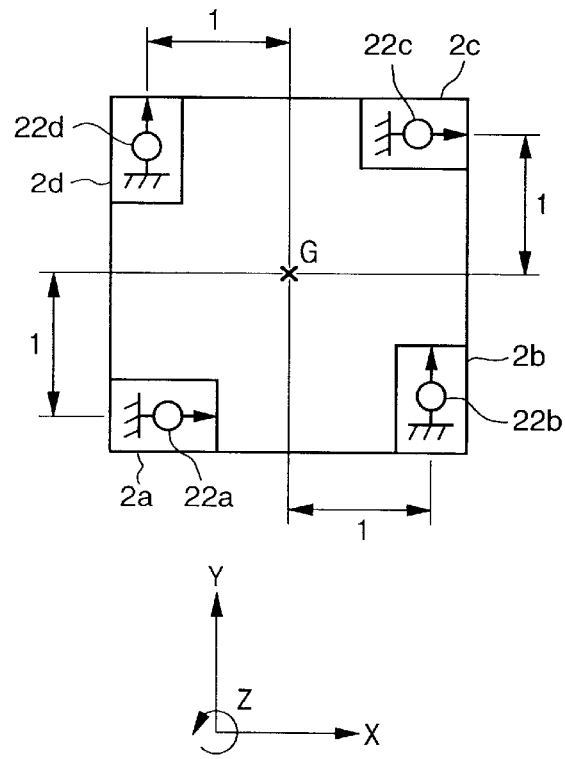
FIG. 4 is an explanatory view showing an arrangement of active anti-vibration mounts and actuators mounted thereon of the active anti-vibration apparatus shown in FIG. 1.

Let the active anti-vibration mounts 2a to 2d be arranged as shown in FIG. 4, for instance. In this arrangement, if the operation directions of the actuators 22a to 22d, mounted on the active anti-vibration mounts 2a to 2d, respectively, for applying control power to the anti-vibration table 1 are as shown by arrows in the corresponding blocks, then the total force of the generated thrusts Fa, Fb, Fc and Fd of the actuators 22a to 22d is applied to the center of gravity G of the anti-vibration table 1 and relationship between the generated thrusts Fa, Fb, Fc and Fd, thrusts Fx and Fy in the two orthogonal horizontal directions X and Y, and moment Mz about the vertical axis Z is as shown in the following operational function (4).

$$\begin{pmatrix} Fx \\ Fy \\ Mz \end{pmatrix} = \begin{pmatrix} 1 & 0 & 1 & 0 \\ 0 & 1 & 0 & 1 \\ 1 & 1 & -1 & -1 \end{pmatrix} \begin{pmatrix} Fa \\ Fb \\ Fc \\ Fd \end{pmatrix} \quad (4)$$

In a case as shown in FIG. 4, the distance between the center of gravity G and each actuator is a unit distance (e.g., 1) both in the X- and Y-axis directions. However, in a case where the distance is L, then the matrix elements in the third row of the above 3×4 conversion matrix in the equation (4) becomes (L, L, -L, -L). The matrix elements in the third row of the conversion matrix include component of length. The inverse of the operational function (4) can be expressed as the following operational function (5).

$$\begin{pmatrix} Fa \\ Fb \\ Fc \\ Fd \end{pmatrix} = \frac{1}{4} \begin{pmatrix} 2 & 0 & 1 \\ 0 & 2 & 1 \\ 2 & 0 & -1 \\ 0 & -2 & -1 \end{pmatrix} \begin{pmatrix} Fx \\ Fy \\ Fz \end{pmatrix} \quad (5)$$

According to the equation (5), instruction signals of the thrusts Fx and Fy in the two horizontal directions X and Y and the moment Mz about the vertical axis Z-axis can be distributed to the actuators 22a to 22d, i.e., the actuators mounted on the respective active anti-vibration mounts 2a to 2d. Note, the distance between the center of gravity G of the anti-vibration table 1 and the operation axis of each of the actuators 22a to 22d is one, as shown in FIG. 4. However, the present invention is not limited to this, and the operational function can be derived in the similar manner when the distance is not the unit distance.

Next, calculation processes performed in the first and second compensation calculation circuits 7 and 9 will be explained.

Figure 5:
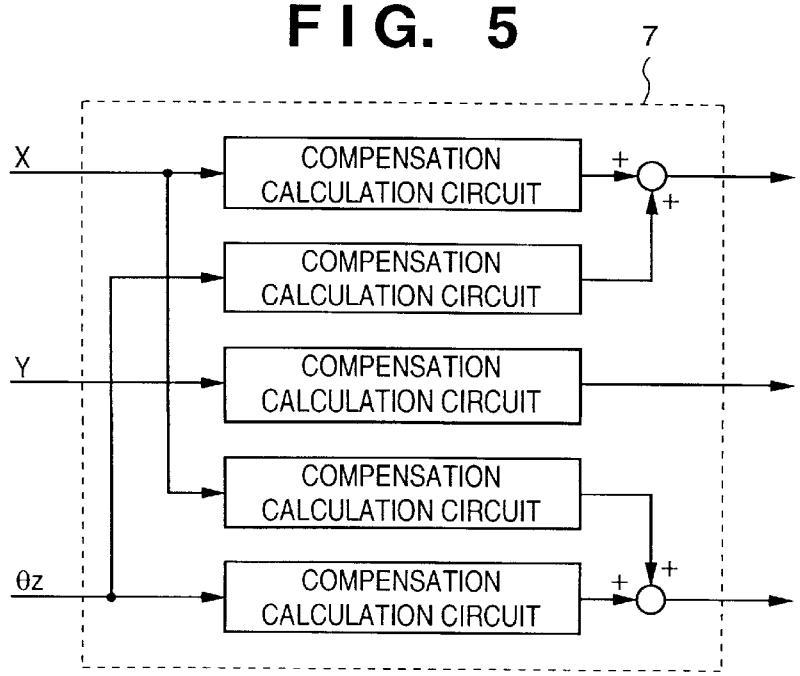
FIG. 5 is a block diagram illustrating an example of a compensator which operates on the basis of motion modes interfering with each other.

The first compensation calculation circuits 7 perform compensation calculation on vibration signals, extracted by the motion mode extractor 6, of the respective motion modes of the anti-vibration table 1, independently of each other. As for compensation calculation, proportional/integrating (PI) compensation, gain compensation, integrating compensation, and combinations thereof may be used. Note, depending upon the arrangement of the active anti-vibration mounts 2a to 2d and the position of the center of gravity of the anti-vibration table 1, the motion modes may interfere with each other. In such cases, the first compensation calculation circuits 7 may be replaced by a compensation calculation circuits 70, as shown in FIG. 5, capable of performing compensation calculation while taking interference between motion modes into consideration. Referring to FIG. 5, a motion mode of the translation in the X-axis direction and a motion mode of rotation about the vertical axis Z are assumed to interfere with each other, and the compensation calculation circuits 70 capable of taking the interference is shown.

Thus, the first compensation calculation circuits 7 and 70 realize to adjust vibration characteristics of a motion mode having a natural frequency in a relatively low frequency range, such as a rigid body motion mode of the anti-vibration table 1, by performing compensation calculation for each motion mode of the anti-vibration table 1.

The second compensation calculation circuits 9 performs compensation calculation by focusing on vibrations of peripheral portions of the anti-vibration table 1 on which the vibration sensors 3a to 3d are attached. As for the compensation calculation, PI compensation, gain compensation, integration compensation, and combinations thereof are applied.

The second compensation calculation circuits 9 controls local vibration modes, which occurs in peripheral portions of the anti-vibration table 1 and cannot be properly compensated by the first compensation calculation circuits 7, having natural frequencies in relatively high frequency range. Accordingly, large local vibrations of high frequencies are restrained, and good vibration control performance is realized.

In the anti-vibration apparatus for controlling the anti-vibration table for each motion mode, when various large local vibrations occur at various peripheral portions of the anti-vibration table due to lack of rigidity of the anti-vibration apparatus, and in the worst case, spill-over phenomena is caused and very large vibration is excited on the anti-vibration table 1.

In the first embodiment, by applying the aforesaid apparatus and control method, stable and excellent performance is realized in the anti-vibration apparatus which controls the anti-vibration table for each motion mode even when various local vibration occurs at various peripheral portions of the anti-vibration table.

Note, in the first embodiment, the anti-vibration apparatus which controls vibrations in the horizontal direction is explained as an example, however, the similar configuration may be applied to an active anti-vibration apparatus which controls the vibrations in the vertical direction.

Further, in the first embodiment, the anti-vibration apparatus which controls motions, in a horizontal plane, of 3-degree-of-freedom, i.e., translation of 2-degree-of-freedom in the horizontal (X- and Y-axes directions) directions and rotation of 1-degree-of-freedom about the vertical axis (Z-axis) is explained. However, the present invention is not limited to this, and remaining rigid body motion modes of 3-degree-of-frequency, i.e., translation of 1-degree-of-freedom in the vertical direction (Z-axis direction) and rotation of 2-degree-of-freedom about horizontal axes (X- and Y-axes) may be combined.

Further, the present invention also includes an anti-vibration apparatus capable of controlling motion modes of 6-degree-of-freedom consists of translation of 3-degree-of-freedom and rotation of 3-degree-of-freedom in addition to the apparatus which controls motion in a horizontal plane of three-degree-of-freedom, as described in the first embodiment.

In the active anti-vibration apparatus according to the first embodiment as described above, vibrations of the anti-vibration table, supported by the anti-vibration supporting mechanism, for mounting precision equipments are detected by the plurality of vibration sensors, the frequency components which are lower than the predetermined frequency out of the signals outputted from the vibration sensors are extracted by the low-pass filter, and the frequency components which are higher than the predetermined frequency out of the signals outputted from the vibration sensors are extracted by the high-pass filter. Then, the vibration signals of motion modes, such as translation and rotation of the anti-vibration table, are extracted on the basis of extracted signals having the frequency components, which are lower than the predetermined frequency, obtained as output signals from the low-pass filter, and the extracted signals of the motion modes are properly compensated. Further, the compensation signal for each motion mode is distributed as the driving instruction signals of the plurality of actuators. Meanwhile, the output signals from the high-pass filter are properly compensated. The distributed signal and the compensation signal of the output signals from the high-pass filter are added and fed back to the actuators for applying control force on the anti-vibration table. The first compensation calculation circuits realize proper adjustment of vibration control characteristics for rigid body motion modes of the anti-vibration table and motion modes of low frequency vibrations. The second compensation calculation circuits perform compensation calculation by focusing on vibrations of various peripheral portions of the anti-vibration table.

Accordingly, the anti-vibration apparatus which controls the anti-vibration table for each motion mode realizes stable and excellent anti-vibration performance even in a case where various local vibrations occur at various peripheral portions of the anti-vibration table. Further, since motion characteristics for motion modes of the anti-vibration table is adjusted, design and adjustment of control parameters of an anti-vibration apparatus can be performed easily and rationally. In other words, it is possible to provide an active anti-vibration apparatus, for mounting precision equipments, capable of increasing vibration control performance and, especially, being easily set with parameters which govern motion characteristics of the anti-vibration apparatus.

Second Embodiment

Next, a second embodiment of the present invention will be explained.

When the motion mode independent control as described in the first embodiment is performed, if the effects of vibrations of natural frequency in supporting members of vibration sensors dominate the overall system, it becomes difficult to measure frequency of the overall system in high precision.

Accordingly, in a configuration of the second embodiment, the vibration sensors are mounted on the anti-vibration table, thereby removing effects of local vibrations.

Figure 6:
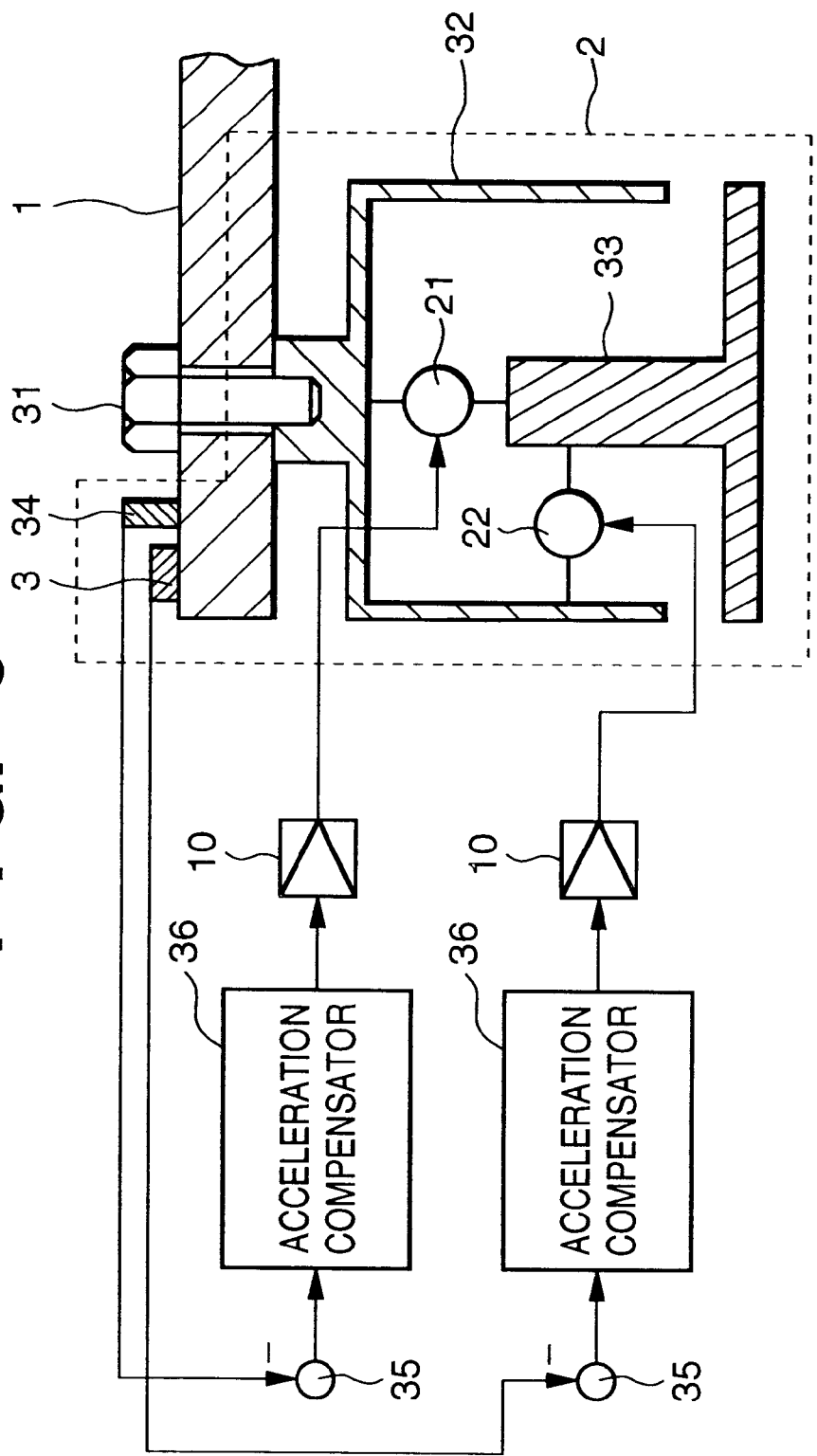
FIG. 6 is a diagram illustrating a configuration of an active anti-vibration apparatus according to a second embodiment of the present invention.

FIG. 6 is a diagram illustrating a configuration of an anti-vibration apparatus according to the second embodiment of the present invention. The anti-vibration table 1 for mounting precision equipments, such as an X-Y stage, is supported by the anti-vibration mounts 2. The anti-vibration table 1 is usually supported by a plurality of anti-vibration mounts 2, and if the anti-vibration table 1 has a quadrangle shape, then anti-vibration mounts 2 are arranged, one at each corner of the anti-vibration table 1. FIG. 6 shows one of the anti-vibration mounts 2.

The main configuration elements of the anti-vibration mount 2 are as follows. The anti-vibration mount 2 supports the anti-vibration table 1 upwardly using a mechanical spring or an air spring (not shown), thereby isolating the anti-vibration table 1 from vibrations of the setting floor. The anti-vibration mount 2 is connected to the anti-vibration table 1 by a joint bolt 31. A rising member 32 rises with the anti-vibration table 1, and a base member 33 is placed on the setting floor. A vertical acceleration sensor 34 for measuring acceleration of the anti-vibration table 1 in the vertical direction and a horizontal acceleration sensor 3 for measuring acceleration of the anti-vibration table 1 in the horizontal direction are fixed on the anti-vibration table 1. Further, a vertical actuator 21 for applying driving force to the anti-vibration table 1 in the vertical direction and a horizontal actuator 22 for applying driving force to the anti-vibration table 1 in the horizontal direction are provided between the base member 33 and the rising member 32. Besides the above elements, the anti-vibration mount 2 in practice includes other mechanisms, such as a viscous member, although they are not shown. However, since FIG. 6 is a conceptual view of the configuration of the active anti-vibration apparatus, only the main configuration elements necessary for actively controlling vibrations are shown. In a case of supporting the anti-vibration table 1 with a plurality of vibration mounts, each vibration mount has the same configuration as that of the anti-vibration mount 2 in FIG. 6.

Characteristics of the anti-vibration mount 2 of the second embodiment is that a vertical acceleration sensor 34 for measuring acceleration of the anti-vibration table 1 in the vertical direction and a horizontal acceleration sensor 3 for measuring acceleration of the anti-vibration table 1 in the horizontal direction are fixed on the anti-vibration table 1. The position of the sensors 34 and 3 are preferably as near as possible to the supporting portion of the anti-vibration table 1 supported by the anti-vibration mount 2.

Next, a configuration of a control system for actively restraining vibrations of the anti-vibration table 1 by the anti-vibration mount 2 is explained. FIG. 6 shows a configuration of a control system for measuring acceleration of vibrations of the anti-vibration table 1 and applying power proportional to the velocity, which is an integrated value of the acceleration, to the anti-vibration table 1, thereby applying damping force to the anti-vibration table 1. The sign of a measurement signal outputted from the vertical acceleration sensor 34 is changed by a sign changer 35, and the sign-changed signal is operated by an acceleration compensator 36. The obtained compensation value is inputted to a power amplifier 10. The power amplifier 10 drives the vertical actuator 21 in accordance with the input signal, thereby driving force in the vertical direction is applied to the anti-vibration table 1. By performing negative feedback for vertical acceleration of the anti-vibration table 1 as described above, damping force in the vertical direction is applied to the anti-vibration table 1. Note, in a case where the vertical actuator 21 is a voice coil motor, the acceleration compensator 36 performs integration in order to generate a velocity signal from an acceleration signal, whereas in a case where the vertical actuator 21 is an air spring, the acceleration compensator 36 performs proportional action since the vertical actuator 21 itself has integrating characteristics. The same operation as described above is performed in the horizontal direction. Namely, the sign of a measurement signal outputted from the horizontal acceleration sensor 3 is changed by the sign changer 35, and the sign-changed signal is operated by the acceleration compensator 36. The obtained compensation value is inputted to the power amplifier 10. The power amplifier 10 drives the horizontal actuator 22 in accordance with the input signal, thereby driving force in the horizontal direction is applied to the anti-vibration table 1. By performing negative feedback for horizontal acceleration of the anti-vibration table 1 as described above, damping force in the horizontal direction is applied to the anti-vibration table 1. Note, in a case where the horizontal actuator 22 is a voice coil motor, the acceleration compensator 36 performs integration in order to generate a velocity signal from an acceleration signal, whereas in a case where the horizontal actuator 22 is an air spring, the acceleration compensator 36 performs proportional action since the actuator 22 itself has integrating characteristics. In a case where the anti-vibration table 1 is supported by a plurality of anti-vibration mounts, a configuration of a control system of each anti-vibration mount is the same as that of the anti-vibration mount 2 in FIG. 6.

According to the second embodiment, the vertical acceleration sensor 34 and the horizontal acceleration sensor 3 are fixed not on the anti-vibration mount 2 but on the anti-vibration table 1. Therefore, components due to peculiar vibrations of the rising member 32 are not included in the measurement signals by the vertical acceleration sensor 34 and the horizontal acceleration sensor 3, which is differing from the conventional apparatus. The reason is that, since the mass of the rising member 32 is much smaller than that of the anti-vibration table 1, vibration energy of the vibrations peculiar to the rising member 32 is not large enough to be conducted to the anti-vibration table 1 having a much larger mass than that of the rising member 32. Accordingly, by fixing the vertical acceleration sensor 34 and the horizontal acceleration sensor 3 to the anti-vibration table 1, it is possible to measure vibrations only of the anti-vibration table 1, which is to be supported, in good precision.

According to the second embodiment, it is possible to remove effects of resonance motion modes of high degree of the configuration mechanisms (vibrations of natural frequencies of high degree), represented by resonance of the rising member 32, from the negative feedback loop of the acceleration. Therefore, the active anti-vibration apparatus can fully utilize its ability, and excellent vibration control of the anti-vibration table 1 can be performed. Even when vibrations of natural frequencies occur in a mechanism, such as the rising member 32, of the anti-vibration apparatus, motion-mode independent control can be applied. Further, since it is possible to avoid the spill-over phenomenon due to resonance motion mode of high degree (vibrations of natural frequencies of high degree), stability of the control system dramatically increases.

Furthermore, according to the second embodiment, high rigidity is not basically required of the anti-vibration mount 2. Thus, it is unnecessary to increase the thickness of the rising member 32 for attaining certain rigidity, thereby the anti-vibration mount 2 can be lightened. Furthermore, since it is also unnecessary to increase rigidity of joint portion of the anti-vibration mount 2 and the anti-vibration table 1, setting up and maintenance work of the anti-vibration mount 2 can be simplified. Accordingly the active anti-vibration apparatus according to the second embodiment is very advantageous in down-weighing and maintenance work.

Third Embodiment

Next, an active anti-vibration apparatus according to a third embodiment of the present invention will be explained.

Figure 7:
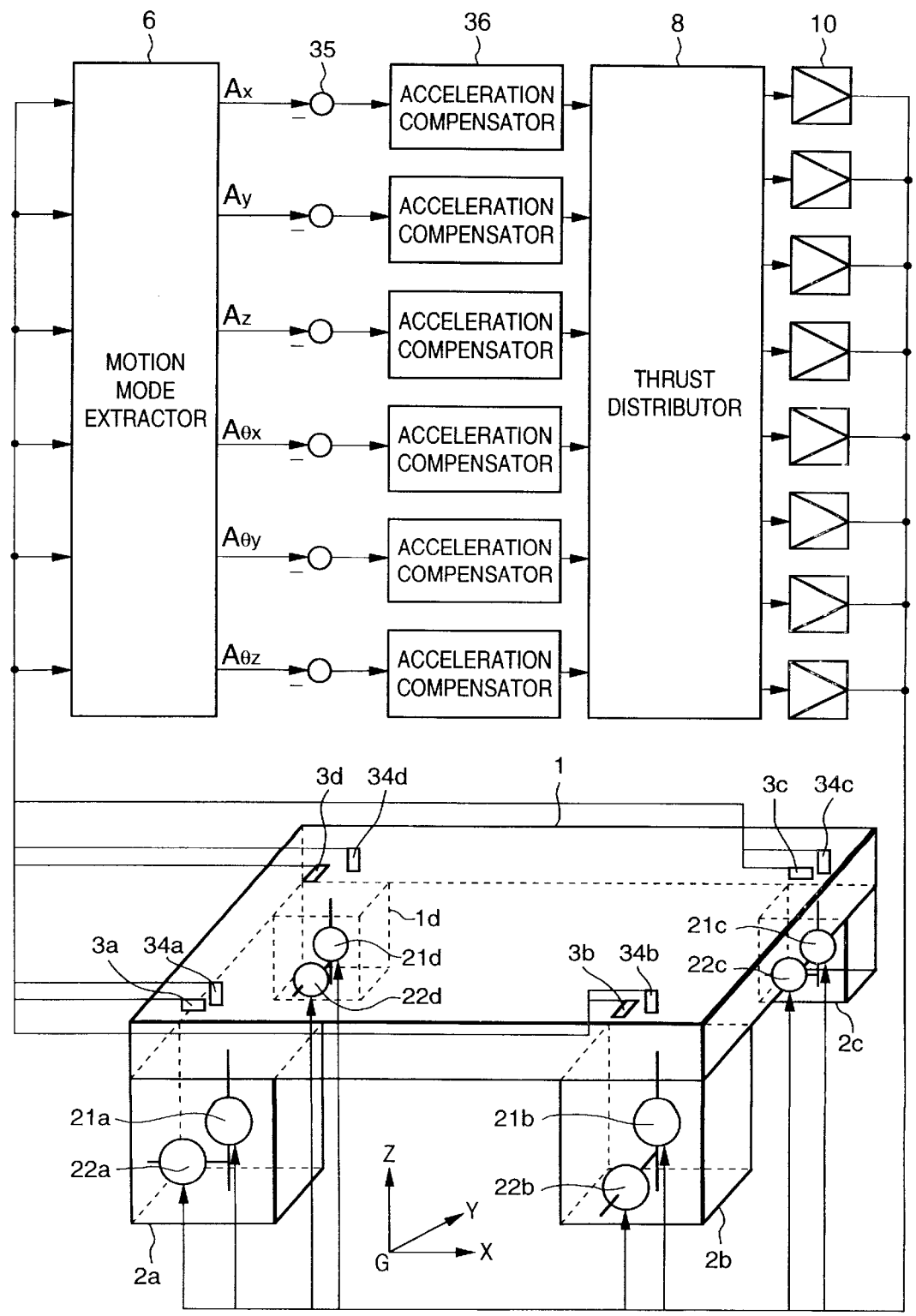
FIG. 7 is a diagram illustrating a configuration of an active anti-vibration apparatus according to a third embodiment of the present invention.
Figure 8:
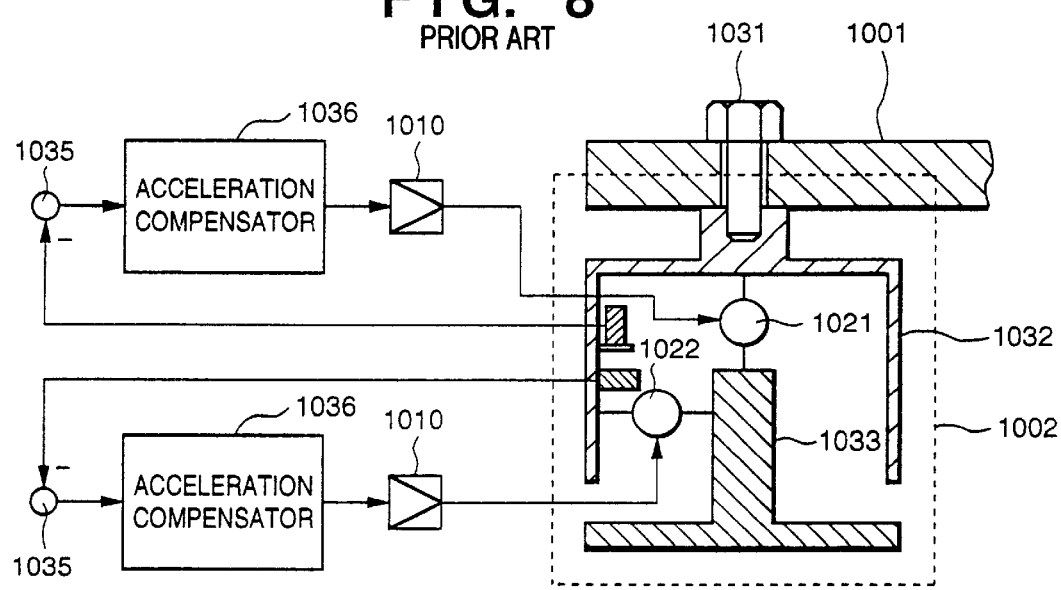
FIG. 8 is a diagram illustrating a configuration of a conventional anti-vibration apparatus.
Figure 9:
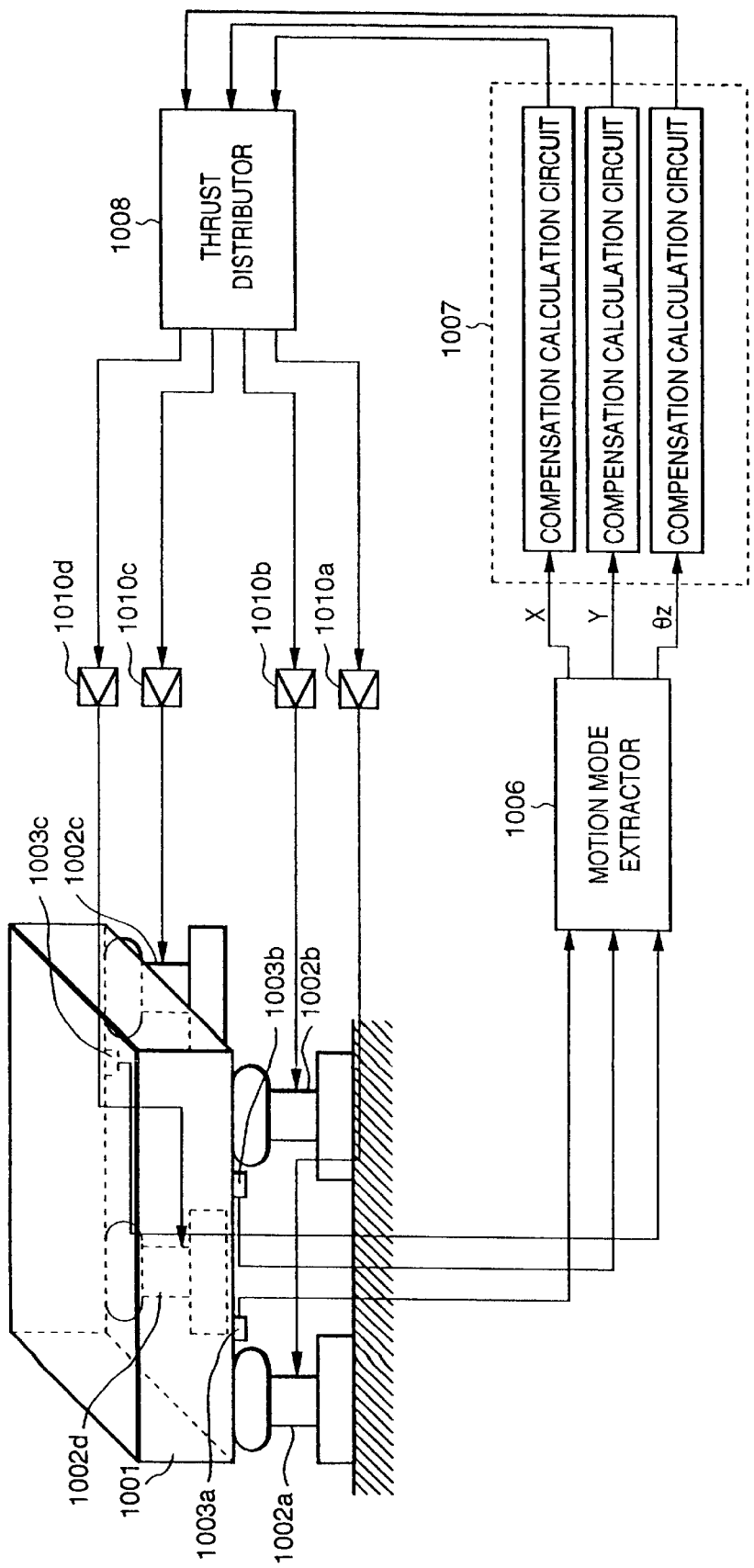
FIG. 9 is a diagram illustrating a configuration of another conventional anti-vibration apparatus which controls vibrations of an anti-vibration table for each motion mode.
Figure 10:
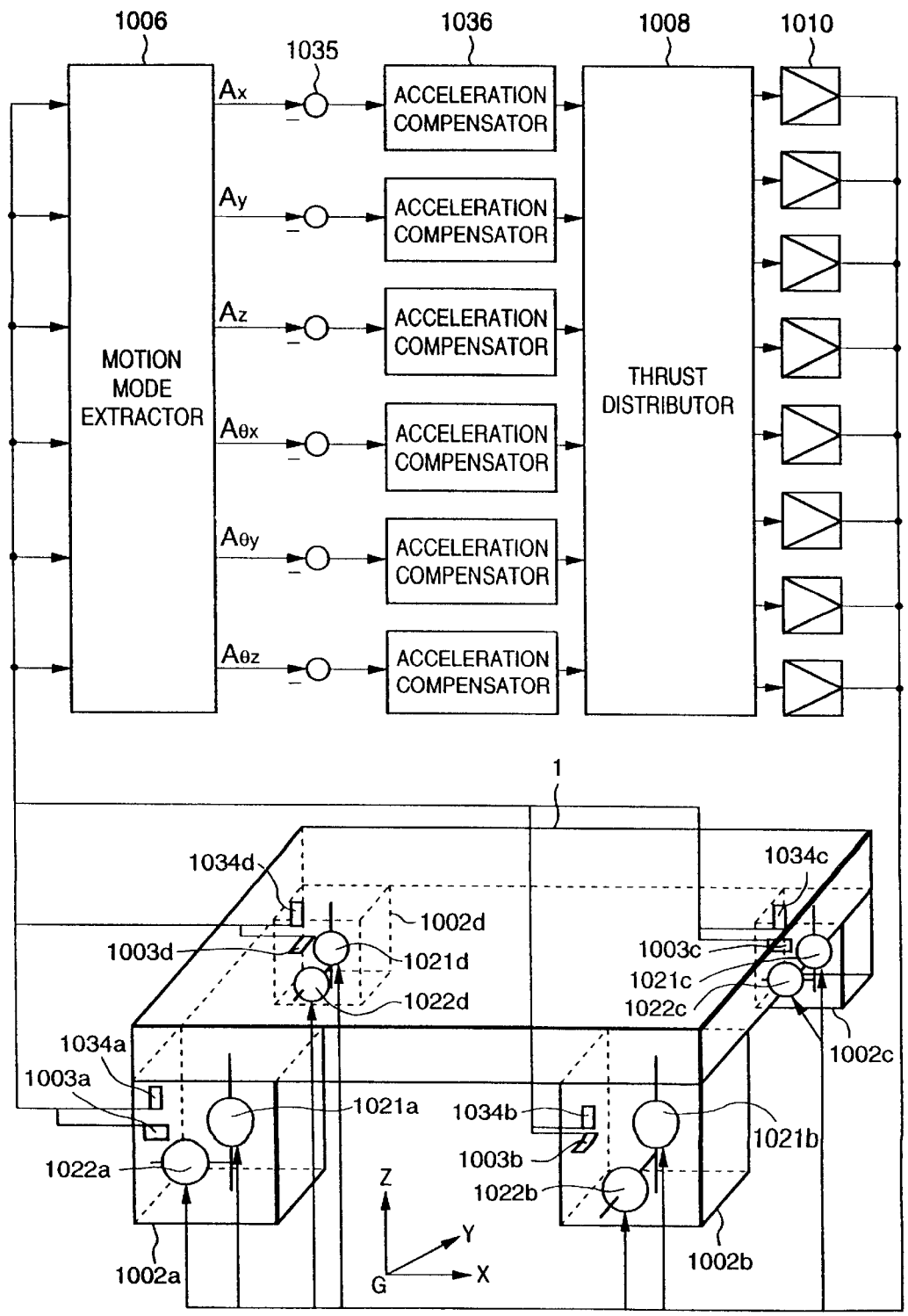
FIG. 10 is a diagram illustrating a configuration of another conventional anti-vibration apparatus which performs motion mode independent control.

FIG. 7 is a diagram illustrating a configuration of the active anti-vibration apparatus according to the third embodiment of the present invention. The control system of this configuration performs motion-mode independent control. Four anti-vibration mounts 2a to 2d support four corners of the anti-vibration 1 which is briefly expressed as a rectangular solid. The anti-vibration mounts 2a to 2d have an identical configuration, and in which of the four anti-vibration mounts 2a to 2d elements are included is distinguished by supplemental alphabets, a to d, attached behind reference numerals of configuration elements. The anti-vibration mount 2a includes a vertical acceleration sensor 34a, a horizontal acceleration sensor 3a, a vertical actuator 21a, and a horizontal actuator 22a. An X-Y-Z orthogonal coordinate system is defined with respect to the anti-vibration table 1 in such a manner that the origin of the X-Y-Z coordinate system is set at the center of gravity G of the anti-vibration table 1, and X- and Y-axes are respectively parallel to two sides of the anti-vibration table 1 having a rectangular solid, and a Z-axis is set in the normal direction to the anti-vibration table 1. Accordingly, the displacement of the anti-vibration table 1 can be expressed as motions of 6-degree-of-freedom constituted by translation x along the X-axis, translation y along the Y-axis, translation z along the Z-axis, rotation motion $\theta x$ about the X-axis, rotation motion $\theta y$ about the Y-axis, and rotation motion $\theta z$ about the Z-axis. In the motion mode independent control performed by the apparatus shown in FIG. 7, negative feedback for acceleration is performed by each of motion modes of 6-degree-of-freedom and damping force is applied to the anti-vibration table 1.

The motion mode extractor 6 calculates acceleration of each of the motion modes, namely, acceleration of the translation Ax along the X-axis, acceleration of the translation Ay along the Y-axis, acceleration of the translation Az along the Z-axis, angular acceleration of the rotation motion $A\theta x$ about the X-axis, angular acceleration of the rotation motion $A\theta y$ about the Y-axis, and angular acceleration of the rotation motion $A\theta z$ about the Z-axis, on the basis of measurement signals from the vertical acceleration sensors 34a to 34d and the horizontal acceleration sensors 3a to 3d, then outputs the calculated results. Then, the sign of acceleration of each of the motion modes is inverted by the sign changer 35, the sign-inverted signal is operated by the acceleration compensator 36, thereby generating a compensation value for each motion mode. The thrust distributor 8 generates driving instructions for the vertical actuators 21a to 21d and the horizontal actuators 22a to 22d on the basis of the inputted compensation values, and transmits them to the power amplifier 10. The thrust distributor 8 generates driving instructions for the vertical actuators 21a to 21d and the horizontal actuators 22a to 22d so that driving force, generated by the acceleration compensator 36 for the respective motion modes, to be applied to the anti-vibration table 1 corresponds to the total force generated by the vertical actuators 21a to 21d and the horizontal actuators 22a to 22d. The power amplifier 10 drives the vertical actuators 21a to 21d and the horizontal actuators 22a to 22d in accordance with the inputted driving instruction signals, thereby applying the driving force to the anti-vibration table 1. As described above, negative feedback for acceleration is performed for each of a plurality of motion modes, thereby applying a damping force to the anti-vibration table 1 to restrain vibrations of the anti-vibration table 1. Note, in a case where the vertical actuators 21a to 21d and the horizontal actuators 22a to 22d are voice coil motors, the acceleration compensator 36 performs integration in order to generate a velocity signal from an acceleration signal, whereas in a case where the vertical actuators 21a to 21d and the horizontal actuators 22a to 22d are air springs, the acceleration compensator 36 performs proportional action since the actuators themselves have integrating characteristics.

An arrangement of the anti-vibration mounts 2a to 2d is as follows. As for the vertical direction, measurement directions of the vertical acceleration sensors 34a to 34d and operation directions of the vertical actuators 21a to 21d match the Z-axis direction. Regarding horizontal directions, the anti-vibration mounts 2a to 2d are arranged in such a manner that the measurement directions of the horizontal acceleration sensors 3a and 3c and operation directions of the horizontal actuators 22a and 22c of the anti-vibration mounts 2a and 2c match the X-axis direction, and measurement directions of the horizontal acceleration sensors 3b and 3d and operation directions of the horizontal actuators 22b and 22d of the anti-vibration mounts 2b and 2d match the Y-axis direction. The reason for arranging the anti-vibration mounts 2a to 2d as described above is that all the motion modes of 6-degree-of-freedom of the anti-vibration table 1 can be measured by the vertical acceleration sensors 34a to 34d and the horizontal acceleration sensors 3a to 3d, and the vibrations of the anti-vibration table 1 can be controlled by the vertical actuators 21a to 21d and the horizontal actuators 22a to 22d. Note, any arrangement of the anti-vibration mounts 2a to 2d other than above as shown in FIG. 7 may be used as long as the aforesaid measurement and control can be satisfied.

According to the third embodiment, the vertical acceleration sensors 34a to 34d and the horizontal acceleration sensors 3a to 3d are fixed not on the anti-vibration mounts 2a to 2d but on the anti-vibration table 1 which is to be supported. Therefore, components due to vibrations peculiar to the rising member 32, as described above, are not included in measurement signals. Thus, it is possible to measure vibrations of the anti-vibration table 1, only, which is to be supported, in high precision. More specifically, accelerations Ax, Ay, Az, A$\theta$x, A$\theta$y, and A$\theta$z, calculated on the basis of the measurement signals by the respective acceleration sensors, for the motion modes of 6-degree-of-freedom of the anti-vibration table 1 are measured in high precision, therefore motion mode independent control is ideally performed. Even when peculiar vibrations occurs in a partial mechanism of the anti-vibration apparatus, such as the rising member 32, it is possible to apply the motion mode independent control.

According to the third embodiment as described above, it is possible to perform good motion mode independent control.

Note, the present invention is applicable to any anti-vibration apparatus which is characterized by fixing acceleration sensors to an anti-vibration table which is to be supported, the present invention is applicable regardless of measurement directions of the acceleration sensors and operation directions of the actuators, the shape of the anti-vibration table, and the number of the anti-vibration apparatus for supporting the anti-vibration table.

The present invention is not limited to the above embodiments and various changes and modifications can be made within the spirit and scope of the present invention. Therefore to apprise the public of the scope of the present invention, the following claims are made.

What is claimed is:

1. An active anti-vibration apparatus comprising:
    an anti-vibration table, supported by an anti-vibration supporting mechanism, for mounting precision equipment;
    a plurality of actuators for applying control power to said anti-vibration table;
    a plurality of vibration detection means for detecting vibrations of said anti-vibration table;
    a low-pass filter for transmitting frequency components which are lower than a predetermined frequency out of signals outputted from said vibration detection means;
    a high-pass filter for transmitting frequency components which are higher than a predetermined frequency out of the signals outputted from said vibration detection means;
    motion mode extraction means for extracting vibration signals of motion modes on the basis of extracted signals having the frequency components which are lower than the predetermined frequency obtained as output signals from said low-pass filter;
    first compensation calculation means for compensating the vibration signals from said motion mode extraction means;
    thrust distribution means for distributing a compensation signal for each motion mode obtained by said first compensation calculation means as driving instruction signals of said plurality of actuators;
    second compensation calculation means for compensating extracted signals having the frequency components which are higher than the predetermined frequency obtained as output signals from said high-pass filter; and
    means for adding output signals from said thrust distribution means and said second compensation calculation means and feeding back the added result to said actuators.

2. The active anti-vibration apparatus according to claim 1, wherein cut-off frequencies of said low-pass filter and said high-pass filter are higher than natural frequencies of all rigid body motion modes of said anti-vibration table.

3. The active anti-vibration apparatus according to claim 1, wherein each of said actuators is a pneumatic actuator, a linear motor which is driven by electromagnetic power, including a voice coil motor, or combination thereof.

4. The active anti-vibration apparatus according to claim 2, wherein each of said actuators is a pneumatic actuator, a linear motor which is driven by electromagnetic power, including a voice coil motor, or combination thereof.

5. The active anti-vibration apparatus according to claim 3, wherein each of said actuators is the pneumatic actuator or the combination of the pneumatic actuator and the linear motor, and the pneumatic actuator functions as the anti-vibration supporting mechanism.

6. The active anti-vibration apparatus according to claim 4, wherein each of said actuators is the pneumatic actuator or the combination of the pneumatic actuator and the linear motor, and the pneumatic actuator functions as the anti-vibration supporting mechanism.

7. The active anti-vibration apparatus according to claim 1, wherein each of said vibration detection means is an acceleration sensor.

8. The active anti-vibration apparatus according to claim 2, wherein each of said vibration detection means is an acceleration sensor.

9. The active anti-vibration apparatus according to claim 3, wherein each of said vibration detection means is an acceleration sensor.

10. The active anti-vibration apparatus according to claim 4, wherein each of said vibration detection means is an acceleration sensor.

11. The active anti-vibration apparatus according to claim 5, wherein each of said vibration detection means is an acceleration sensor.

12. The active anti-vibration apparatus according to claim 6, wherein each of said vibration detection means is an acceleration sensor.

13. The active anti-vibration apparatus according to claim 1, wherein said first compensation calculation means performs gain compensation, integration compensation, or combination thereof.

14. The active anti-vibration apparatus according to claim 1, wherein said first compensation calculation means performs compensation calculation on the basis of the vibration signals of the motion modes while interfering the vibration signals with each other.

15. The active anti-vibration apparatus according to claim 1, wherein the motion modes are constituted by translation and rotation of said anti-vibration table.

* * * * *